United States Patent [19]

Yoneda

[11] Patent Number: 4,833,316
[45] Date of Patent: May 23, 1989

[54] ROTARY ENCODER

[75] Inventor: Shigeo Yoneda, Yamatokoriyama, Japan

[73] Assignee: Sharp Kabushiki Kaisha, Osaka, Japan

[21] Appl. No.: 903,131

[22] Filed: Sep. 3, 1986

[30] Foreign Application Priority Data

Sep. 5, 1985 [JP] Japan .................. 60-196195

[51] Int. Cl.⁴ ............................. G01D 05/34
[52] U.S. Cl. .................... 250/231 SE; 250/237 G
[58] Field of Search ............... 250/231 SE, 237 G; 340/347 M

[56] References Cited

U.S. PATENT DOCUMENTS 4,593,269  6/1986  Nakamura et al. ........ 250/231 SE X
4,654,523  3/1987  Tanaka et al. ............ 250/231 SE
4,654,525  3/1987  Ebina et al. .............. 250/231 SE
4,658,132  4/1987  Nishiura et al. .......... 250/231 SE
4,658,133  4/1987  Nishiura .................. 250/231 SE

FOREIGN PATENT DOCUMENTS 3438461  5/1985  Fed. Rep. of Germany.

Primary Examiner—Thomas H. Tarcza
Assistant Examiner—Mark Hellner
Attorney, Agent, or Firm—Birch, Stewart, Kolasch & Birch

[57] ABSTRACT

A photoelectric rotary encoder comprises some optical sensor pairs of light emitting elements and light receiving elements, a rotary disc formed with a plurality of slits at a first pitch, and a fixed plate provided with some slits at a second pitch. The first pitch is greater than the second pitch. Preferably, the difference between the first pitch and the second pitch is smaller than a half of the first pitch.

2 Claims, 2 Drawing Sheets

ROTARY ENCODER

BACKGROUND OF THE INVENTION

The present invention relates to a rotary encoder and, more particularly, to a photoelectric rotary encoder for detecting the rotational speed and the movement distance.

The conventional photoelectric rotary encoder comprises a rotary disc provided with a plurality of slits. The rotary disc is positioned across a light path of a photo-interpreter. The rotation of the disc is detected by detecting the light passing the slits of the disc and outputting signals.

The detection accuracy of the minimum rotational distance depends upon a pitch between the slits of the rotary disc. To increase the accuracy, accordingly the slit pitch must be miniaturized. However, it is very difficult to provide the slits with a fine pitch in the disc. Further, since the slits are provided at the peripheral of the disc in a concentric circle manner, it is impossible to detect the rotation direction of the disc.

SUMMARY OF THE INVENTION

Accordingly, it is an object of the present invention to provide an improved photoelectric rotary encoder for detecting the rotation speed and the movement distance.

It is another object of the present invention to provide an improved photoelectric rotary encoder for detecting the rotational direction of a disc as well as the rotational speed and the rotational deviation.

Briefly described, in accordance with the present invention, a photoelectric rotary encoder comprises some pairs of light emitting elements and light receiving elements, a rotary disc, and a fixed plate. The rotary disc is provided with a plurality of slits. The fixed plate is provided with some detection slits, the pitch of which is identical with the pitch of the pairs of light emitting elements and light receiving elements. The pitch of the slits on the rotary disc is different at a predetermined pitch from the pitch of the detection slits of the fixed plate. Preferably, the pitch difference is smaller than a half of the pitch of the slits on the rotary disc.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Figure 1:
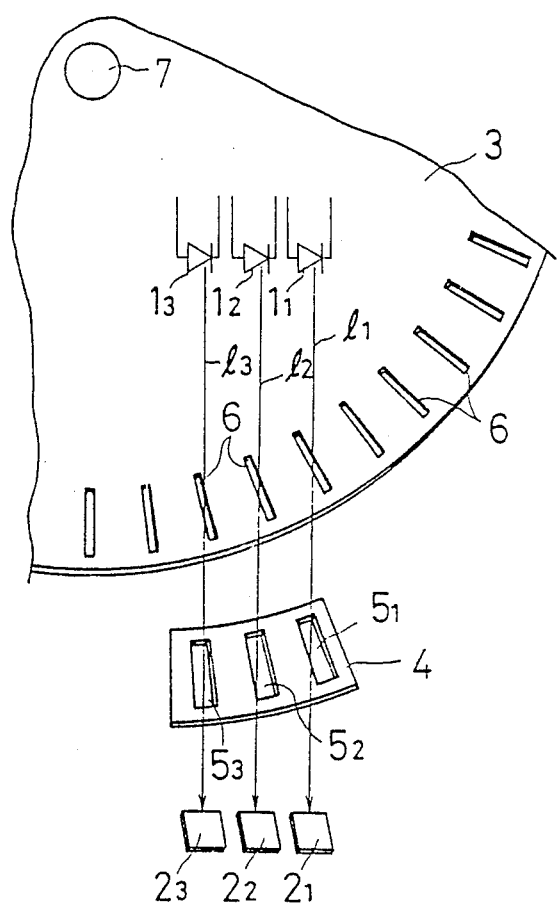
FIG. 1 is a perspective view of a photoelectric rotary encoder according to the present invention.

FIG. 1 is a perspective view of a photoelectric rotary encoder according to the present invention.

The photoelectric rotary encoder of the present invention comprises three light emitting elements $1_1$–$1_3$, and three light receiving elements $2_1$–$2_3$. One light emitting element and one light receiving element are positioned at the upper side and the lower side of a rotary disc to form one photodetector pair. The three light emitting elements and the light receiving elements are provided with a constant pitch P1. A rotary disc 3 and a fixed plate 4 are interposed between the three light emitting elements and the three light receiving elements. The fixed plate 4 is provided with three detection slits $5_1$–$5_3$. The rotary disc 3 is provided with a plurality of slits 6 around its periphery with a constant pitch P2. The slits 6 and the detection slits $5_1$–$5_3$ are aligned in a light path $1_1$–$1_3$ between the light emitting elements and the light receiving elements.

When the rotary disc 3 rotates around its axis 7 to thereby change the phase, the position of the slits 6 on the rotary disc 3 intermittently agrees with the position of the detection slits $5_1$–$5_3$ of the fixed plate 4, so that the light can intermittently pass through from the light emitting elements to the light receiving elements. The light receiving elements $2_1$–$2_3$ can receive the light and output the signals after photoelectric conversion.

Figure 2:
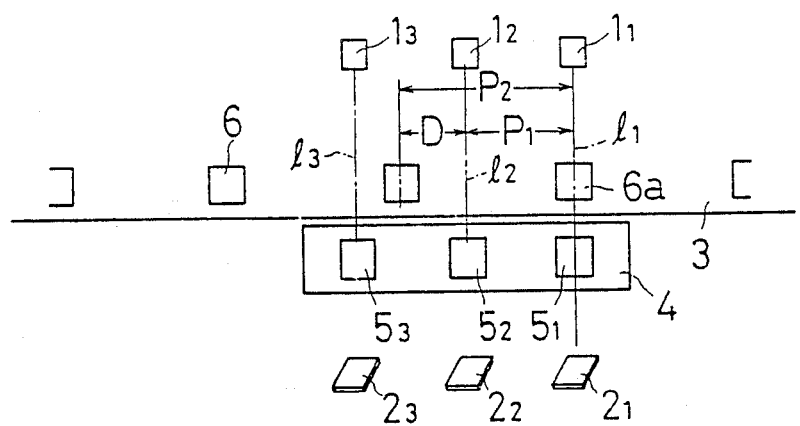
FIG. 2 shows a relation of slits of a rotary disc and a fixed plate, light emitting elements, light receiving elements.

FIG. 2 is a relative arrangement between the slits of the disc and the fixed plate, the light emitting elements, and the light receiving elements.

The pitch P1 of the slits $5_1$–$5_3$ of the fixed plate 4 is somewhat smaller than the pitch P2 of the slits 6 on the rotary disc 3. Preferably, the difference D between the pitches P2 and P1 (D=P2−P1) is smaller than a half of the pitch P2 (P2×½).

With the above arrangement, the light emitted from the light emitting elements $1_1$–$1_3$ can be received by the light receiving elements $2_1$–$2_3$, respectively. Assuming that the light emitting elements $1_1$–$1_3$, the first slits $5_1$, and the slit 6a of the rotary disc 3 are aligned in a light path $1_1$, the light from the first light emitting element $1_1$ only is received by the first light receiving element $2_1$. When the rotary disc 3 rotates at the pitch difference D in a counterclockwise direction in FIG. 2, the light from the first light emitting element $1_1$ is shut out by the rotary disc 3 while the light from the second light emitting element $1_2$ only is received by the second light receiving element $2_2$. Thus, the pitch difference D corresponds to the minimum detection length of rotation, thereby enabling high detection accuracy of rotation. When the rotary disc 3 rotates further at the pitch difference D in the counterclockwise direction, the light from the third light emitting element $1_3$ only is detected by the third light receiving element $2_3$.

Thus, when the rotary disc 3 rotates in the counterclockwise direction, the first photosensor pair—the second one—third pair—the first pair— . . . are subsequently operated to pass the light. One photosensor pair is paired from the three light emitting elements $1_1$–$1_3$ and the light receiving elements $2_1$–$2_3$. On the contrary, when the rotary disc 3 rotates in the clockwise direction, the first photosensor pair—the third one—the second one—the first one— . . . are subsequently operated. The detection of the light passing order enables the rotational direction of the rotary disc 3 to be specified.

Figure 3:
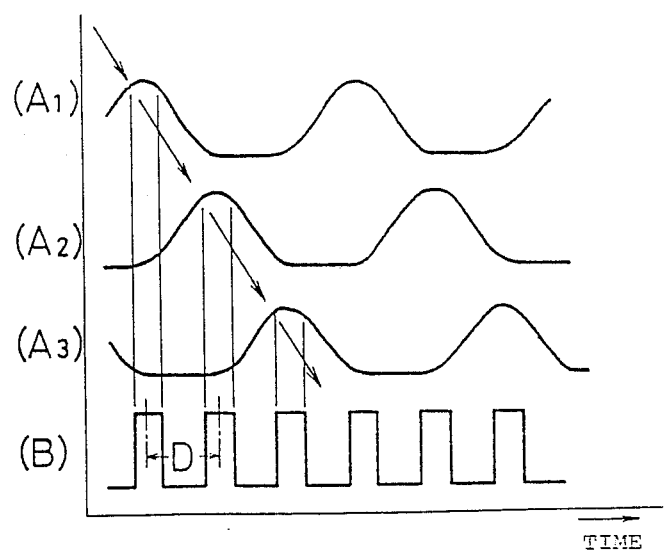
FIG. 3 is a timing chart of signals outputted by the light receiving elements.

FIG. 3 is a timing chart of the signals outputted from the light receiving elements $2_1$–$2_3$.

When the rotary disc 3 rotates, the light receiving elements $2_1$–$2_3$ output the sine waves A1–A3. When the rotary disc 3 rotates in the counterclockwise direction, the peaks of the sine waves A1–A3 show a phase difference corresponding to the pitch difference D to each other. The sine waves A1–A3 are detected by an OR logic circuit and entered into a Schmitt trigger circuit to shape the waves to make pulses rising at each pitch difference D as rotational detection pulses B. The cycle of the rotational detection pulses B is synchronous with the pitch difference D. By counting the rotational detection pulses B, the rotational deviation can be detected. By counting the pulses B in a predetermined time, the rotation speed of the disc 3 can be calculated. By detecting the occurrence of the detection signals A1–A3 as stated above, the rotational direction can be specified.

Thus, according to the rotary encoder of the present invention, the rotational distance, the rotational speed, the rotational direction can be detected. The number of the light emitting elements and the light receiving elements need not be limited to three as above stated. At least two pairs of light emitting elements and light receiving elements can be used.

While only certain embodiments of the present invention have been described, it will be apparent to those skilled in the art that various changes and modifications may be made therein without departing from the spirit and scope of the present invention as claimed.

What is claimed is:

1. A photoelectric rotary encoder comprising:
   light emitting means for emitting light, said light emitting means comprising a plurality of light emitting elements arranged at a first pitch;
   light receiving means for receiving the light from said light emitting means;
   rotation disc means provided with a plurality of slits at a second pitch, said rotation disc means being capable of rotating and said encoder determines direction of rotation of said rotation disc means by determining sequences of light detections by said light receiving means; and
   fixed plate means provided with slits positioned at a pitch which is substantially the same as the first pitch;
   the second pitch of the slits on said rotary disc means being greater than the pitch of the slits on said fixed plate means, the difference between the second pitch of the slits on said rotary disc means and the pitch of the slits on said fixed plate means being smaller than a half of the second pitch of the slits on said rotary disc means, said difference corresponding to a minimum detection length of rotation.

2. A photoelectric rotary encoder comprising:
   light emitting means for emitting light, said light emitting means comprising a plurality of light emitting elements arranged at a first pitch;
   light receiving means for receiving the light from said light emitting means;
   rotation disc means provided with a plurality of slits at a second pitch, said rotation disc means being capable of rotation;
   fixed plate means with slits positioned at a pitch which is substantially the same as the first pitch;
   the second pitch of the slits on said rotary disc means being greater than the pitch of the slits on said fixed plate means, the difference between the second pitch of the slits on said rotary disc means and the pitch of the slits on said fixed plate means being smaller than a half of the second pitch of the slits on said rotary disc means, said difference corresponding to a minimum detection length of rotation;
   means for outputting signals from said light receiving means in response to detection of light from said light emitting means, said signals indicating said difference between the second pitch and the pitch of the slits on the fixed plate means;
   control means for forming detection signals, said control means comprising at least an OR logic circuit and a Schmitt trigger circuit, said OR logic circuit receiving said signals from said means for outputting and entering them into said Schmitt trigger circuit, said Schmitt trigger circuit thereafter outputting said detection signals; and
   means for counting the detection signals and for determining rotational speed of said rotation disc means by calculating the number of detection signals for a predetermined period of time.

* * * * *